US010201852B2

(12) United States Patent
Suganuma et al.

(10) Patent No.: US 10,201,852 B2
(45) Date of Patent: Feb. 12, 2019

(54) SILVER PARTICLE SYNTHESIZING METHOD, SILVER PARTICLES, CONDUCTIVE PASTE PRODUCING METHOD, AND CONDUCTIVE PASTE

(71) Applicant: OSAKA UNIVERSITY, Osaka (JP)

(72) Inventors: Katsuaki Suganuma, Suita (JP); Jinting Jiu, Suita (JP)

(73) Assignee: OSAKA UNIVERSITY, Osaka (JP)

( * ) Notice: Subject to any disclaimer, the term of this patent is extended or adjusted under 35 U.S.C. 154(b) by 70 days.

(21) Appl. No.: 15/318,903

(22) PCT Filed: Jun. 16, 2015

(86) PCT No.: PCT/JP2015/067270
§ 371 (c)(1),
(2) Date: Dec. 16, 2016

(87) PCT Pub. No.: WO2015/194536
PCT Pub. Date: Dec. 23, 2015

(65) Prior Publication Data
US 2017/0144220 A1 May 25, 2017

(30) Foreign Application Priority Data
Jun. 16, 2014 (JP) ................. 2014-123394

(51) Int. Cl.
B22F 1/00 (2006.01)
B22F 9/24 (2006.01)
(Continued)

(52) U.S. Cl.
CPC .............. B22F 1/0022 (2013.01); B22F 1/00 (2013.01); B22F 1/0014 (2013.01); B22F 9/24 (2013.01);
(Continued)

(58) Field of Classification Search
CPC ................. B22F 1/0018; G01J 3/44
(Continued)

(56) References Cited

U.S. PATENT DOCUMENTS 8,968,608 B2    3/2015  Kuramoto et al.
2007/0034052 A1* 2/2007  Vanheusden .......... B22F 1/0018
                                              75/362
(Continued)

FOREIGN PATENT DOCUMENTS

JP    S61-276901 A    12/1986
JP    H04-323310 A    11/1992
(Continued)

OTHER PUBLICATIONS

The extended European search report issued by the European Patent Office dated Jan. 18, 2018, which corresponds to European Patent Application No. 15808870.8-1103 and is related to U.S. Appl. No. 15/318,903.
(Continued)

Primary Examiner — Khanh T Nguyen
(74) Attorney, Agent, or Firm — Studebaker & Brackett PC

(57) ABSTRACT

A silver particle synthesizing method includes reducing a dispersant from first silver particles each covered with the dispersant to obtain second silver particles. The method further includes synthesizing third silver particles each having a larger particle diameter than the second silver particles by causing a reaction between a silver compound and a reductant in a liquid phase containing the second silver particles.

10 Claims, 13 Drawing Sheets

(51) Int. Cl.
| | |
|---|---|
| H01B 1/00 | (2006.01) |
| H01B 1/22 | (2006.01) |
| H01B 5/00 | (2006.01) |
| H01B 13/00 | (2006.01) |
| H05K 1/09 | (2006.01) |
| C09D 7/40 | (2018.01) |
| C09D 5/24 | (2006.01) |

(52) U.S. Cl.
CPC ............... *C09D 5/24* (2013.01); *C09D 7/68* (2018.01); *C09D 7/69* (2018.01); *H01B 1/00* (2013.01); *H01B 1/22* (2013.01); *H01B 5/00* (2013.01); *H01B 13/00* (2013.01); *H05K 1/09* (2013.01); *H05K 1/092* (2013.01); *B22F 2009/245* (2013.01); *B22F 2301/255* (2013.01); *B22F 2304/054* (2013.01); *B22F 2304/056* (2013.01); *B22F 2304/058* (2013.01); *B22F 2304/10* (2013.01); *B22F 2998/10* (2013.01); *H05K 2201/0203* (2013.01)

(58) Field of Classification Search
USPC ............................................. 75/362; 356/301
See application file for complete search history.

(56) References Cited

U.S. PATENT DOCUMENTS

| | | | |
|---|---|---|---|
| 2009/0225310 A1* | 9/2009 | Yang | ................... G01N 21/658 356/301 |
| 2009/0246358 A1 | 10/2009 | Winkel | |
| 2010/0186999 A1 | 7/2010 | Kuramoto et al. | |
| 2012/0247275 A1 | 10/2012 | Yang et al. | |
| 2013/0192423 A1 | 8/2013 | Yang et al. | |
| 2013/0313490 A1 | 11/2013 | Eiden et al. | |
| 2015/0171299 A1 | 6/2015 | Kuramoto et al. | |

FOREIGN PATENT DOCUMENTS

| | | |
|---|---|---|
| JP | 2000-001707 A | 1/2000 |
| JP | 2005-203304 A | 7/2005 |
| JP | 2008-223058 A | 9/2008 |
| JP | 2009-170277 A | 7/2009 |
| JP | 2009-235474 A | 10/2009 |
| JP | 5207281 B2 | 6/2013 |
| JP | 2014-503682 A | 2/2014 |
| WO | 2006050251 A2 | 5/2006 |
| WO | 2009/090915 A1 | 7/2009 |

OTHER PUBLICATIONS

Hyun Geun Han et al., Preparation of Conductive Silver Paste Using Bimodal Particles, Journal of Nanoscience and Nanotechnology, vol. 8, No. 10, Oct. 1, 2008, pp. 5576-5580.

Benjamin Wiley et al., Shape-Controlled Synthesis of Metal Nanostructures: The Case of Silver, Chemistry—A European Journal, vol. 11, No. 2, Jan. 7, 2005, pp. 454-463.

International Search Report issued in PCT/JP2015/067270; dated Sep. 15, 2015.

Suganuma et al.; Low-temperature low-pressure die attach with hybrid silver particle paste; Microelectronics Reliability 52; 2012; pp. 375-380.

Slow; Are Sintered Silver Joints Ready for Use as Interconnect Material in Microelectronic Packaging?; Journal of Electronic Materials; Jan. 17, 2014; pp. 1-15.

* cited by examiner

SILVER PARTICLE SYNTHESIZING METHOD, SILVER PARTICLES, CONDUCTIVE PASTE PRODUCING METHOD, AND CONDUCTIVE PASTE

TECHNICAL FIELD

The present invention relates to a silver particle synthesizing method, silver particles, a conductive paste producing method, and a conductive paste.

BACKGROUND ART

A conductive paste that contains a lower alcohol and silver particles having an average particle diameter (median diameter) in the order of micrometers (also referred to below as silver micro-particles) has been known as a wiring material or a conductive bonding material (see Patent Literature 1, for example). The order of micrometers herein means the order of at least 1 μm and less than 1 mm. A traditionally employed method for obtaining silver micro-particles is processing of flattening silver particles having an average particle diameter (median diameter) in the order of nanometers (also referred to below as silver nanoparticles). The order of nanometers herein means the order of at least 1 nm and less than 1 μm. A traditionally employed method for obtaining silver nanoparticles is powder solidification of melted silver by spraying (a so called atomizing method). A conductive paste containing the silver micro-particles produced by the atomizing method and the flattening processing has a resistivity (volume resistivity) in the order of $10^{-6}$ Ω·cm when the conductive paste is baked or sintered at a temperature of at least 200° C. in an atmosphere.

CITATION LIST

Patent Literature

[Patent Literature 1] Japanese Patent Application Laid-Open Publication No. 2009-170277

SUMMARY OF INVENTION

Technical Problem

However, in a situation in which a target product (for example, a wiring substrate) on which a wire is to be formed or bonding target products (for example, a lead frame and a wiring substrate) has/have low thermal resistivity, baking or sintering temperature may be limited to about 150° C. as an upper limit. For this reason, there is a demand for a conductive paste having sufficiently low resistivity even when produced through baking or sintering at a low temperature of about 150° C. Typical order of the resistivity required for a wiring material and a bonding material is no greater than the order of $10^{-5}$ Ω·cm.

By contrast, the resistivity of a conductive paste containing the silver micro-particles produced through the atomizing method and the flattening processing can have sufficiently low resistivity (resistivity in the order of $10^{-5}$ Ω·cm) only when the conductive paste is subjected to baking or sintering at a temperature of at least 180° C. in an atmosphere. One of factors therein is insufficient packability of the silver particles contained in the conductive paste (packing density of the silver particles). This is due to impossibility of producing silver particles having uniform particle diameter and shape by a combination of the atomizing method and the flattening processing.

The present invention has been made in view of the foregoing and has its object of providing a silver particle synthesizing method that can improve packability of silver particles, silver particles, a conductive paste producing method, and a conductive paste.

Solution to Problem

A silver particle synthesizing method according to the present invention includes: reducing a dispersant from first silver particles each covered with the dispersant to obtain second silver particle; and synthesizing third silver particles each having a larger particle diameter than the second silver particles by causing a reaction between a first silver compound and a first reductant in a liquid phase containing the second silver particles.

In an embodiment, the third silver particles each have a polyhedral shape.

In one embodiment, the third silver particles each have a particle diameter in order of micrometers.

In one embodiment, in the synthesizing third silver particles, fourth silver particles are synthesized in addition to the third silver particles. The fourth silver particles each have a particle diameter that is larger than respective particle diameters of the second silver particles and that is in order of nanometers.

In one embodiment, the first reductant is a first polyalcohol.

In one embodiment, in the synthesizing third silver particles, the third silver particles are synthesized by heating the first polyalcohol in which the first silver compound is dissolved and in which the second silver particles are dispersed.

In one embodiment, in the synthesizing third silver particles, the third silver particles are synthesized by dripping a second polyalcohol into a third polyalcohol and heating the first polyalcohol. The first silver compound is dissolved in the second polyalcohol. The second silver particles are dispersed in the third polyalcohol. The first polyalcohol includes the second and third polyalcohols.

In one embodiment, the third polyalcohol is heated while the second polyalcohol is dripped.

In one embodiment, the method further includes synthesizing the first silver particles each covered with the dispersant by causing a reaction between a second silver compound and a second reductant in a liquid phase containing the dispersant.

In one embodiment, the second reductant is a fourth polyalcohol. In the synthesizing first silver particles, the first silver particles are synthesized by heating the fourth polyalcohol in which the second silver compound is dissolved and in which the dispersant is dispersed.

In one embodiment, the second silver particles each have a particle diameter of at least 100 nanometers and no greater than 500 nanometers.

Silver particles according to the present invention includes: first silver particles each having a particle diameter of at least 1 micrometer and no greater than 15 micrometers; and second silver particles each having a particle diameter of at least 100 nanometers and less than 1 micrometer.

A conductive paste producing method according to the present invention includes: reducing a dispersant from first silver particles each covered with the dispersant to obtain second silver particles; synthesizing third silver particles each having a larger particle diameter than the second silver particles by causing a reaction between a silver compound and a reductant in a liquid phase containing the second silver particles; and producing a conductive paste by mixing the third silver particles with an alcohol.

A conductive paste according to the present invention includes: first silver particles each having a particle diameter of at least 1 micrometer and no greater than 15 micrometers; second silver particles each having a particle diameter of at least 100 nanometers and less than 1 micrometer; and an alcohol.

In one embodiment, the conductive paste has an electric resistivity in order of $10^{-5}$ $\Omega \cdot cm$ after baking.

Advantageous Effects of Invention

According to the present invention, packability of silver particles can be improved.

DESCRIPTION OF EMBODIMENTS

Figure 1:
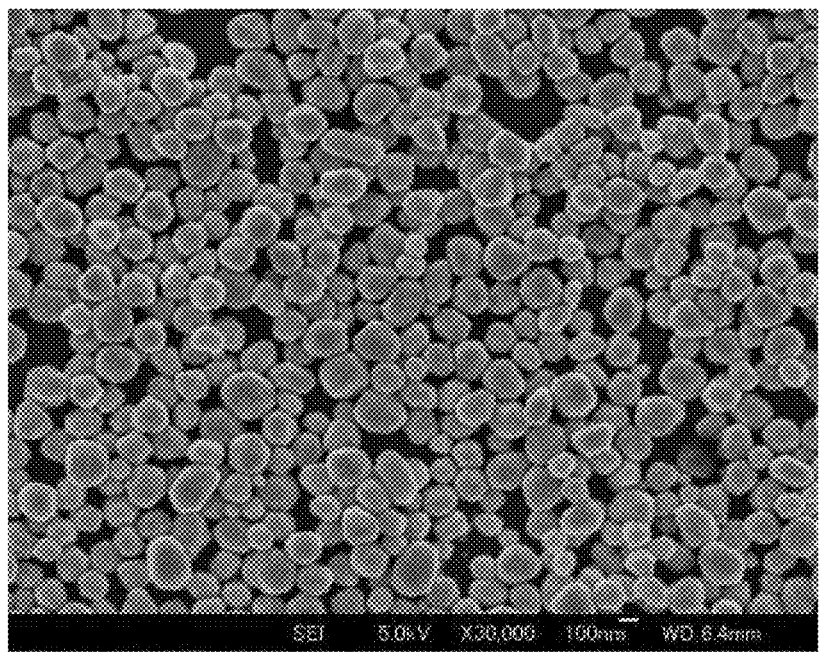
FIG. 1 presents one example SEM image of silver core particles according to an embodiment of the present invention.

The following describes embodiments of a silver particle synthesizing method, silver particles, a conductive paste producing method, and a conductive paste according to the present invention. Note that the present invention is not limited to the following embodiments.

A description will be made first about a silver particle synthesizing method and silver particles according to the present embodiment. The silver particle synthesizing method according to the present embodiment includes three steps. In a first step, silver particles (also referred to below as silver core particles) that each are a core are synthesized by a polyol process using a silver compound C1. In a second step, a dispersant that covers the silver core particles is reduced. In a third step, the silver core particles are grown using another silver source (silver compound C2).

Specifically, a reaction between the silver compound C1 and a reductant R1 is caused in a liquid phase containing a dispersant D. In the present embodiment, the reductant R1 is a polyalcohol PA1. After the silver compound C1 is dissolved and the dispersant D is dispersed in the polyalcohol PA1, the polyalcohol PA1 is heated. Through the above heating, a reaction (liquid phase reduction) between the silver compound C1 and the polyalcohol PA1 proceeds (first step). By the above reaction, silver atoms are synthesized to generate (precipitate) silver core particles P1 covered with the dispersant D. The use of the dispersant D allows the silver core particles P1 to be covered with the dispersant D. Through the above, the silver core particles P1 can be synthesized that have an average particle diameter (median diameter) in the order of nanometers and that are excellent in dispersibility. The silver core particles P1 preferably have an average particle diameter (median diameter) of about 100 nm to 500 nm. Note that the average particle diameter (median diameter) of silver particles can be measured using a laser.

No particular limitation is imposed on the type of the silver compound C1, and silver nitrate, acetic acid silver, silver carboxylate, or the like may be used as the silver compound C1. No particular limitation is imposed also on the respective types of the dispersant D and the polyalcohol PA1. Examples of the dispersant D include polyvinylpyrrolidone (PVP), polyethylene glycol (PEG), and cetyltrimethylammonium bromide (CTAB). Examples of the polyalcohol PA1 include ethylene glycol, propylene glycol, 1,3-propanediol, 1,4-butanediol, and glycerin.

No particular limitation is also imposed on respective amounts of the silver compound C1, the polyalcohol PA1, and the dispersant D. For example, in a situation in which the amount of the polyalcohol PA1 is selected from a range between 1 g and 100 g, the amount of the silver compound C1 can be selected from a range between 0.01 g and 10 g and the amount of the dispersant D can be selected from a range between 0.008 g and 8 g.

The reaction temperature in the first step is not particularly limited but is preferably at least 100° C. The reason for the above is that it takes too long time for reaction (synthesis of the silver core particles P1) in a situation in which the reaction temperature is less than 100° C. In view of cost, the reaction temperature is preferably no greater than 200° C.

Note that the liquid phase containing the dispersant D may contain another liquid such as water in addition to the polyalcohol PA1. Furthermore, another reductant such as ethanol, propylene glycol, 1,3-propanediol, 1,4-butanediol, or glycerin may be used as an additional reductant R1 in addition to the polyalcohol PA1. Alternatively, a reductant other than the polyalcohol PA1 may be used as the reductant R1, such as propylene glycol, 1,3-propanediol, 1,4-butanediol, glycerin, glucose, ascorbic acid, $NaBH_4$, or hydrazine.

The synthesized silver core particles P1 can be observed for example using a scanning electron microscope (SEM). FIG. 1 presents an example SEM image of the silver core particles P1. The silver core particles P1 presented in FIG. 1 was synthesized by the following procedure.

That is, 1.0 g of silver nitrate (silver compound C1) was dissolved in 50 g of ethylene glycol (polyalcohol PA1) first. Next, 0.5 g of polyvinylpyrrolidone (dispersant D) was dispersed in the ethylene glycol PA1. The temperature of the ethylene glycol PA1 was increased up to 150° C. (reaction temperature). The ethylene glycol PA1 was then stirred at a rotational speed of 500 rpm for one hour for reaction while the reaction temperature was kept at 150° C. At that time, a reaction between the silver nitrate C1 and the ethylene glycol PA1 generated a nitrogen oxide gas. Note that the ethylene glycol PA1 acts as both a reductant for the silver nitrate C1 and a solvent of the silver nitrate C1 in the reaction.

Through the above procedure, the silver core particles P1 that have an average particle diameter (median diameter) of around 200 nm and that are excellent in dispersibility could be obtained, as presented in FIG. 1. Note that silver core particles P1 synthesized by the same procedure (treatment) as that for obtaining the silver core particles P1 in FIG. 1 may be also referred to below as "silver core particles P1 (reaction temperature 150° C.)".

The second step is performed after the synthesis of the silver core particles P1. In the second step, the silver core particles P1 are first separated from the liquid phase (polyalcohol PA1) using a metal mesh or the like. The dispersant D that covers the silver core particles P1 is reduced then. For example, washing the silver core particles P1 using water or ethanol can reduce the dispersant D. Alternatively, heating the silver core particles P1 can reduce the dispersant D.

The third step is then performed. That is, a reaction between the silver compound C2 and a reductant R2 is caused in a liquid phase containing the silver core particles P1. In the present embodiment, the reductant R2 is a polyalcohol PA2. The silver compound C2 is dissolved and the silver core particles P1 are dispersed in the polyalcohol PA2. The reaction (liquid phase reduction) between the silver compound C2 and the polyalcohol PA2 are then caused by heating the polyalcohol PA2. Through the above reaction, silver particles derived from the silver compound C2 are generated and the generated silver particles are synthesized with the silver core particles P1. As a result, silver particles P2 each having a larger particle diameter than the silver core particles P1 are obtained (synthesized). Specifically, the silver particles P2 have an average particle diameter (median diameter) in the order of micrometers. That is, the silver particles P2 each are a silver micro-particle and preferably have a particle diameter of at least 1 µm and no greater than 15 µm.

Preferably, after a polyalcohol PA2b in which the silver compound C2 is dissolved is dripped into a polyalcohol PA2a containing the silver core particles P1, the liquid phase reduction (reaction) is allowed to proceed by heating. More preferably, the polyalcohol PA2a is heated while the polyalcohol PA2b is dripped. In a situation in which the polyalcohol PA2b in which the silver compound C2 is dissolved is dripped, the average particle diameter of the silver micro-particles P2 can be controlled by changing a time period of the dripping.

Note that the same polyalcohol PA2 is used as the polyalcohols PA2a and PA2b in the present embodiment but the polyalcohols PA2a and PA2 may be different from each other.

The synthesized silver micro-particles P2 preferably are uniform in particle diameter (median diameter) and shape (inherent form). The uniform particle diameter and shape can result in improvement of packability of the silver particle. Furthermore, the silver micro-particles P2 preferably have a polyhedral shape. That is, a planar crystal surface forms an outer appearance shape of a silver particle P2. This can improve packability of the silver particles. In addition, since the silver particles P2 have an average particle diameter in the order of micrometers, packing density of the silver particles increases, thereby improving packability.

No limitation is imposed on the type of the silver compound C2, and silver nitrate, acetic acid silver, silver carboxylate, or the like may be used as the silver compound C2. Also, the polyalcohols PA2, PA2a, and PA2b are not particularly limited in type and may be ethylene glycol, propylene glycol, 1,3-propanediol, 1,4-butanediol, glycerin, or the like.

By contrast, the average particle diameter and the shape (inherent form) of the silver micro-particles P2 vary depending on respective concentrations of the silver core particles P1 and the silver compound C2. For example, in a situation in which the amount of the silver core particles P1 is selected from a range between 0.01 g and 5 g, the silver micro-particles P2 having uniform particle diameter and shape can be obtained through selection of the amount of the silver compound C2 from a range between 0.1 g and 50 g and the amount of the polyalcohol PA2 from a range between 1 g and 100 g. Furthermore, the silver micro-particles P2 can have a polyhedral shape.

The reaction temperature in the third step is preferably no greater than 200° C. The reason for the above is that the reaction temperature over 200° C. leads to so fast reaction speed, thereby making it difficult to control the shape of the silver micro-particles P2 into a desired shape (polyhedral shape). The reaction temperature in the third step is preferably at least 100° C. The reason for the above is that it takes too long time for reaction (synthesis of the silver micro-particles P2) in a condition in which the reaction temperature is less than 100° C.

Moreover, silver particles P3 having an average particle diameter smaller than the silver micro-particles P2 are synthesized in the course of synthesis of the silver micro-particles P2 in the present embodiment. The silver particles P3 have an average particle diameter (median diameter) in the order of nanometers. Synthesis of the silver particles P3 can yield further improvement of packability. Specifically, the silver particles P3 serve to fill gaps between the silver micro-particles P2. The silver particles P3 may be referred to below as silver nanoparticles P3. The silver nanoparticles P3 preferably have an average particle diameter (median diameter) of at least 100 nm and less than 1 µm.

According to the silver particle synthesizing method described above, the silver particles P2 each having a polyhedral shape and a particle diameter in the order of micrometers (preferably, at least 1 micrometer and no greater than 15 micrometers) can be obtained without performing the flattening processing. Note that the liquid phase containing the silver core particles P1 in the third step may contain another liquid such as water in addition to the polyalcohol PA2 (or polyalcohol PA2a). Similarly, a liquid phase containing, in addition to the polyalcohol PA2b, another liquid such as water in which the silver compound C2 is dissolved may be dripped. Furthermore, another reductant such as propylene glycol, 1,3-propanediol, 1,4-butanediol, or glycerin may be used as the reductant R2 in addition to the polyalcohol PA2. Alternatively, a reductant other than the polyalcohol PA2 may be used as the reductant R2, such as propylene glycol, 1,3-propanediol, 1,4-butanediol, glycerin, glucose, ascorbic acid, $NaBH_4$, or hydrazine.

Figure 2:
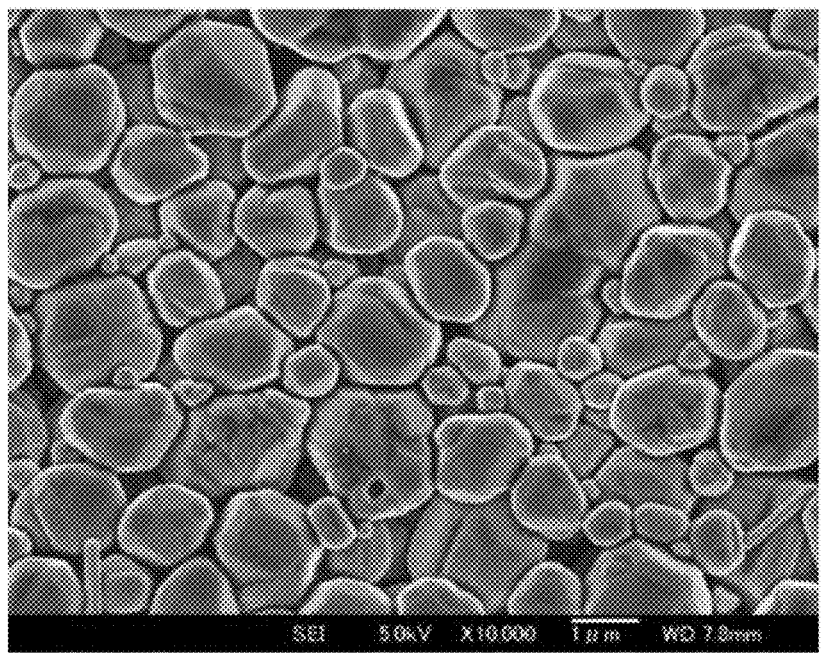
FIG. 2 presents one example SEM image of silver particles according to an embodiment of the present invention.

The silver micro-particles P2 and the silver nanoparticles P3 thus synthesized can be observed for example using a scanning electron microscope. FIG. 2 presents one example SEM image of the synthesized silver particles (silver micro-particles P2 and silver nanoparticles P3). The silver particles (silver micro-particles P2 and silver nanoparticles P3) presented in FIG. 2 were synthesized by the following procedure.

That is, 2.0 g of silver nitrate (silver compound C2) was first dissolved in 50 g of ethylene glycol (polyalcohol PA2) while the ethylene glycol PA2 was stirred at a rotational speed of 500 rpm. Then, 0.05 g of the silver core particles P1 were dispersed in the ethylene glycol PA2. The silver core particles (reaction temperature 150° C.) were used as the silver core particles P1 herein. Specifically, the silver core particles (reaction temperature 150° C.) were synthesized and then separated from the liquid phase using a metal mesh. Thereafter, the silver core particles (reaction temperature 150° C.) separated from the liquid phase were washed using water. The washed silver core particles (reaction temperature 150° C.) were dispersed in the ethylene glycol PA2.

Subsequently, the temperature of the ethylene glycol PA2 was increased up to 150° C. (reaction temperature). The ethylene glycol PA2 was then stirred at a rotational speed of 500 rpm for one hour for reaction while the reaction temperature was kept at 150° C. A reaction between the silver nitrate C2 and the ethylene glycol PA2 at that time generated a nitrogen oxide gas. Note that the ethylene glycol PA2 acts as both a reductant for the silver nitrate C2 and a solvent of the silver nitrate C2 in the above procedure.

Through the above procedure, the silver micro-particles P2 having uniform particle diameter and polyhedral shape could be obtained without performing the flattening processing, as presented in FIG. 2. Furthermore, gaps between the silver micro-particles P2 were filled with the silver nanoparticles P3. In shorts, the silver particles having excellent dispersibility and packability could be obtained. Note that silver particles (silver micro-particles P2 and silver nanoparticles P3) synthesized through the same procedure (treatment) as that for the silver particles (silver micro-particles P2 and silver nanoparticles P3) presented in FIG. 2 may be also referred to below as "silver particles (reaction temperature 150° C.)".

Figure 3A:
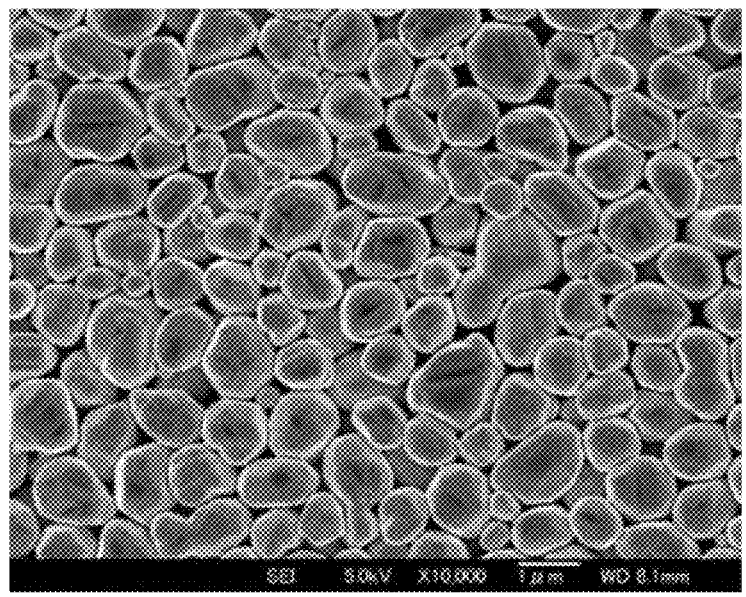
FIG. 3A presents one example SEM image of silver particles according to an embodiment of the present invention.
Figure 3B:
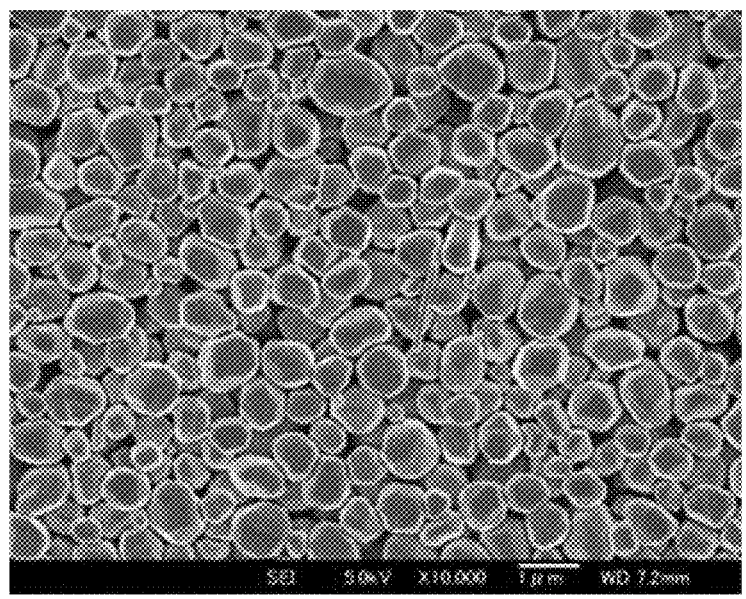
FIG. 3B presents one example SEM image of silver particles according to an embodiment of the present invention.

The following describes influence of the reaction temperature in the third step on the respective particle diameters of the silver micro-particles P2 and the silver nanoparticles P3 with reference to FIGS. 2, 3A, 3B, 4, 5, and 6. FIG. 3A presents one example SEM image of silver particles (silver micro-particles P2 and silver nanoparticles P3) synthesized through the third step at a reaction temperature of 130° C. FIG. 3B represents one example SEM image of silver particles (silver micro-particles P2 and silver nanoparticles P3) synthesized through the third step at a reaction temperature of 200° C. The silver particles (silver micro-particles P2 and silver nanoparticles P3) presented in FIGS. 3A and 3B were synthesized through the same procedure as for the silver particles (reaction temperature 150° C.) except for difference in the reaction temperature in the third step.

Note that silver particles (silver micro-particles P2 and silver nanoparticles P3) synthesized through the same procedure (treatment) as that for the silver particles (silver micro-particles P2 and silver nanoparticles P3) presented in FIG. 3A may be also referred to below as "silver particles (reaction temperature 130° C.)". Silver particles (silver micro-particles P3 and silver nanoparticles P3) synthesized through the same procedure (treatment) as that for the silver particles presented in FIG. 3B (silver micro-particles P2 and silver nanoparticles P3) may be also referred to below as "silver particles (reaction temperature 200° C.)".

Figure 4:
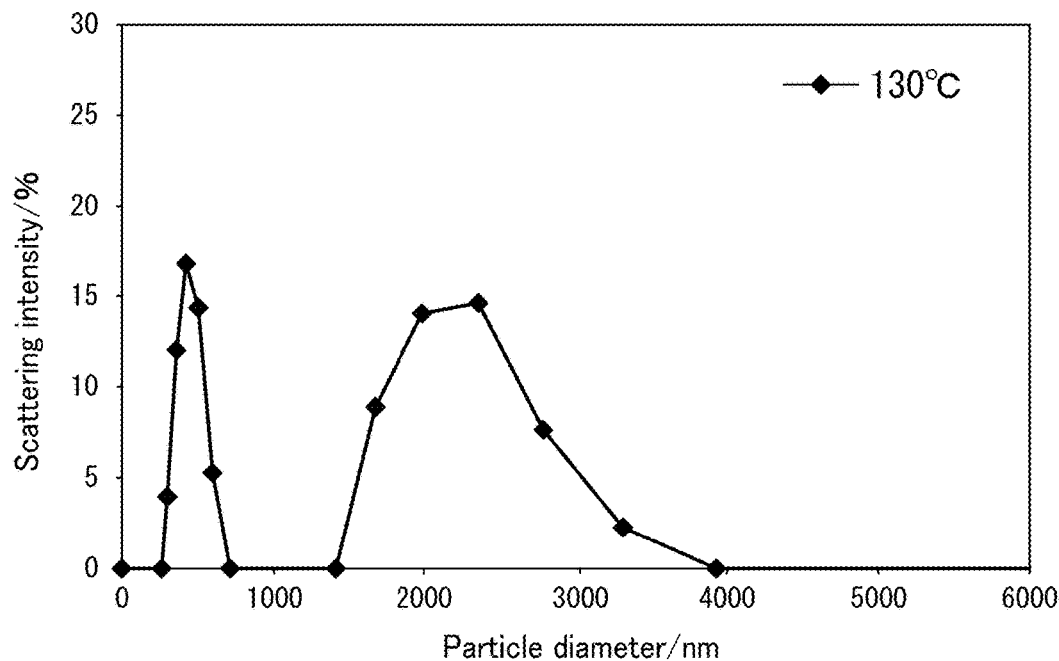
FIG. 4 is a graph representation indicating one example particle diameter distribution of silver particles according to an embodiment of the present invention.
Figure 5:
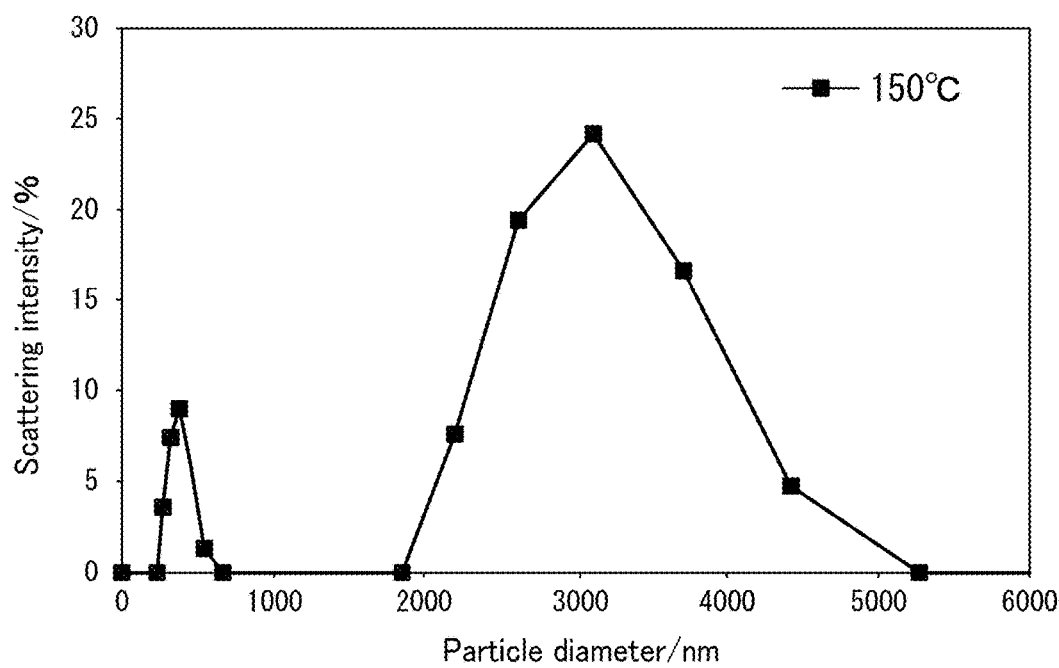
FIG. 5 is a graph representation indicating one example particle diameter distribution of silver particles according to an embodiment of the present invention.
Figure 6:
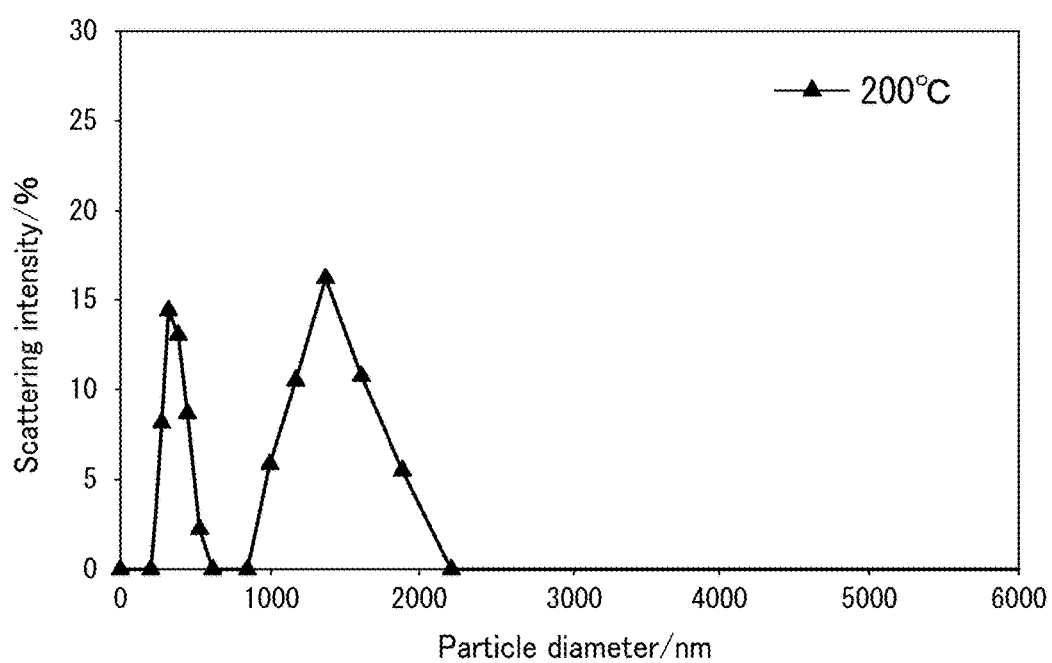
FIG. 6 is a graph representation indicating one example particle diameter distribution of silver particles according to an embodiment of the present invention.

FIG. 4 is a graph representation indicating a particle diameter distribution of the silver particles (reaction temperature 130° C.). FIG. 5 is a graph representation indicating a particle diameter distribution of the silver particles (reaction temperature 150° C.). FIG. 6 is a graph representation indicating a particle diameter distribution of the silver particles (reaction temperature 200° C.). In FIGS. 4-6, the respective vertical axes represent scattering intensity (%) and the respective horizontal axes represent the particle diameter (nm). The particle diameter distributions indicated in FIGS. 4-6 were obtained by analyzing respective scattering intensity distributions. The scattering intensity distributions were obtained using a laser.

As indicated in FIG. 4-6, the silver particles P2 having an average particle diameter in the order of micrometers and the silver particles P3 having an average particle diameter in the order of nanometers were synthesized even in any condition in which the reaction temperature in the third step was set at 130° C., 150° C., or 200° C. Specifically, as indicated in FIG. 4, the silver nanoparticles P3 each had a particle diameter in a range between about 200 nm and 600 nm and the silver micro-particles P2 each had a particle diameter in a range between 1.5 µm and 3.8 µm in a condition in which the third step was performed at a reaction temperature of 130° C. As indicated in FIG. 5, the silver nanoparticles P3 each had a particle diameter in a range between about 250 nm and 800 nm and the silver micro-particles P2 each had a particle diameter in a range between 1.8 µm and 5.2 µm in a condition in which the third step was performed at a reaction temperature of 150° C. Also, as indicated in FIG. 6, the silver nanoparticles P3 each had a particle diameter in a range between about 200 nm and 600 nm and the silver micro-particles P2 each had a particle diameter in a range between 0.9 µm and 2.2 µm in a condition in which the third step was performed at a reaction temperature of 200° C. As such, although the respective average particle diameters of the resultant silver micro-particles P2 and the resultant silver particles P3 varied according to the reaction temperature in the third step, silver particles (silver micro-particles P2 and silver particles P3) having excellent dispersibility and packability could be obtained even in any of the above conditions of the reaction temperature, as presented in FIGS. 2, 3A, and 3B.

A description will be made next about results of measurement of X-ray diffraction intensity by irradiating the silver core particles (reaction temperature 150° C.), the silver particles (reaction temperature 130° C.), the silver particles (reaction temperature 150° C.), and the silver particles (reaction temperature 200° C.) with an X-ray. The measurement results indicate that a peak value (X-ray diffraction intensity) of crystal surfaces each at a mirror index of (111) was maximum in any of the silver core particles (reaction temperature 150° C.), the silver particles (reaction temperature 130° C.), the silver particles (reaction temperature 150° C.), and the silver particles (reaction temperature 200° C.). Furthermore, a peak value (X-ray diffraction intensity) of crystal surfaces each at a mirror index of (200) was second maximum. The above indicates that the silver core particles (reaction temperature 150° C.), the silver particles (reaction temperature 130° C.), the silver particles (reaction temperature 150° C.), and the silver particles (reaction temperature 200° C.) each have a polyhedral inherent form (shape).

Table 1 below indicates a ratio (intensity ratio) of peak values between the crystal surfaces each at a mirror index of (111) and those each at a mirror index of (200).

TABLE 1

| Intensity ratio | Seed | 130° C. | 150° C. | 200° C. |
|---|---|---|---|---|
| I(111)/I(200) | 2.539 | 1.97 | 1.727 | 1.859 |

In Table 1: "Seed" represents the silver core particles (reaction temperature 150° C.); "130° C." represents the silver particles (reaction temperature 130° C.); "150° C. represents the silver particles (reaction temperature 150° C.); and "200° C." represents the silver particles (reaction temperature 200° C.). Furthermore, "I(111)/I(200)" represents a ratio (intensity ratio) of the peak values between the crystal surfaces each at a mirror index of (111) and the crystal surfaces each at a mirror index of (200).

As indicated in Table 1, the rate of the crystal surfaces each at a mirror index of (200) slightly varied according to the reaction temperature in the third step. This indicates that the average particle diameter and the shape (inherent form) of the finally synthesized silver particles vary depending on the reaction temperature in the third step.

The following describes a situation in which the polyalcohol PA2b in which the silver compound C2 is dissolved is dripped into the polyalcohol PA2a containing the silver core particles P1 in the third step.

Figure 7:
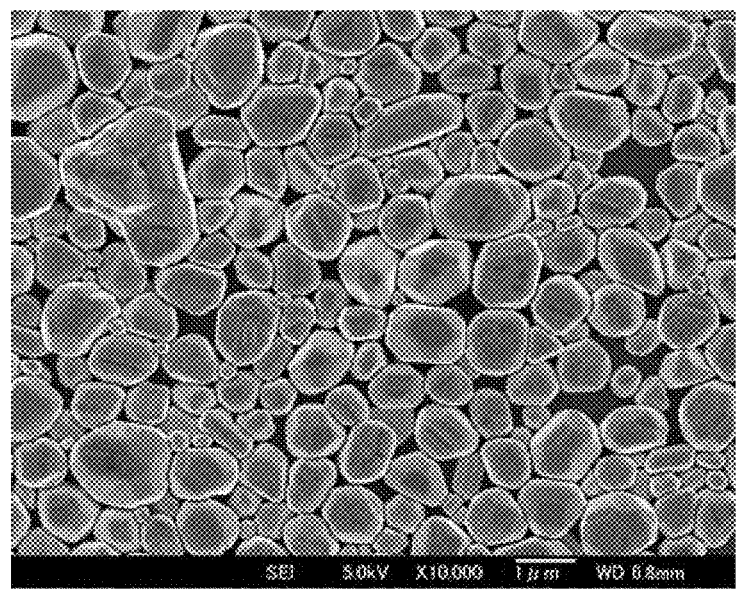
FIG. 7 presents one example SEM image of silver particles according to an embodiment of the present invention.

FIG. 7 presents one example SEM image of silver particles (silver micro-particles P2 and silver nanoparticles P3) obtained through dripping the polyalcohol PA2b in which the silver compound C2 is dissolved into the polyalcohol PA2a containing the silver core particles P1. The silver particles (silver micro-particles P2 and silver nanoparticles P3) presented in FIG. 7 were synthesized by the following procedure.

Specifically, 0.5 g of polyvinylpyrrolidone (dispersant D) was dispersed in 50 g of ethylene glycol (polyalcohol PA1a) and 1.0 g of silver nitrate (silver compound C1) was dissolved in 25 g of ethylene glycol (polyalcohol PA1b). The ethylene glycols PA1a and PA1b were mixed together then.

Subsequently, the temperature of the mixed ethylene glycol (polyalcohol PA1) was increased up to 150° C. (reaction temperature). The resultant mixture was then stirred at a rotational speed of 350 rpm for 20 minutes for reaction while the reaction temperature was kept at 150° C. A reaction between the silver nitrate C1 and the ethylene glycol PA1 at that time generated a nitrogen oxide gas.

Thereafter, the silver core particles P1 were separated from the ethylene glycol PA1 using a metal mesh and washed then using water. Subsequently, 0.01 g of the washed silver core particles P1 were dispersed in 5 g of ethylene glycol (polyalcohol PA2a) to prepare ethylene glycol PA2a containing 0.2 wt % of the silver core particles P1. While on the other hand, 1.0 g of silver nitrate (silver compound C2) was dissolved in 50 g of ethylene glycol (polyalcohol PA2b). After the temperature of the ethylene glycol PA2a was increased up to 150° C., the ethylene glycol PA2b was dripped into the ethylene glycol PA2a over 30 minutes while the ethylene glycol PA2a was stirred at a rotational speed of 350 rpm with the reaction temperature thereof kept at 150° C., thereby mixing the ethylene glycols PA2a and PA2b together.

Subsequently, the mixed ethylene glycol (polyalcohol PA2) was stirred at a rotational speed of 350 rpm for 30 minutes for reaction while being kept at 150° C. (reaction temperature). A reaction between the silver nitrate C2 and the ethylene glycol PA2 at that time generated a nitrogen oxide gas.

Through the above procedure, the silver micro-particles P2 could be obtained without performing the flattening processing. The resultant silver particles (silver micro-particles P2 and silver nanoparticles P3) had excellent dispersibility and packability, as shown in FIG. 7. Note that the particle diameters of the resultant silver particles (silver micro-particles P2 and silver nanoparticles P3) were different from those of the silver particles (reaction temperature 150° C.).

Figure 8:
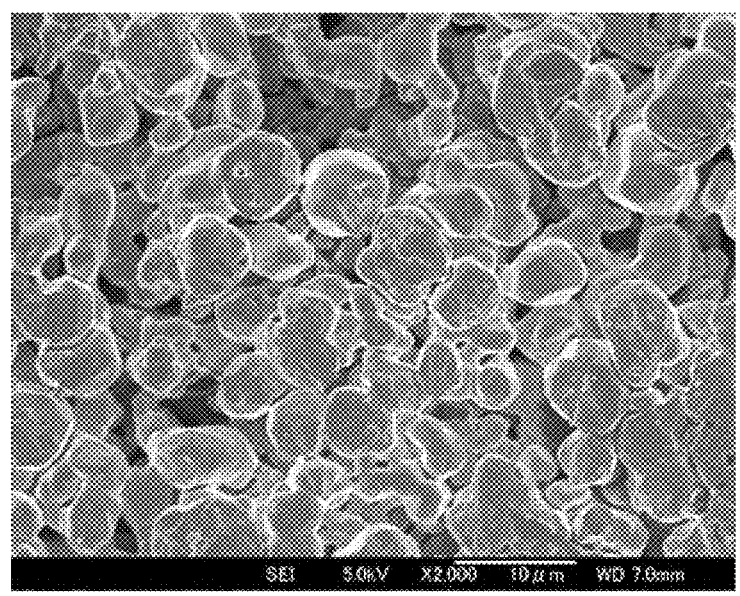
FIG. 8 presents an example SEM image in a first comparative example.

The following describes next a situation in which no dispersant D is used in the first step. FIG. 8 presents one example SEM image of silver particles (first comparative example) synthesized using no dispersant D. The silver particles presented in FIG. 8 were synthesized by the following procedure.

That is, 1 g of silver nitrate (silver compound C1) was dissolved in 50 g of ethylene glycol (polyalcohol PA1) first. Subsequently, the ethylene glycol PA1 was increased in temperature up to 150° C. (reaction temperature) and then stirred at a rotational speed of 500 rpm for one hour for reaction while the reaction temperature was kept at 150° C. A reaction between the silver nitrate C1 and the ethylene glycol PA1 at that time generated a nitrogen oxide gas.

The above procedure resulted in the silver particles presented in FIG. 8. However, the silver particles agglomerated into large lumps due to the use of no dispersant D. The agglomerated silver particles are not favorable for a paste material. The agglomerated silver particles each have large projections and recesses and accordingly were not in a polyhedral shape. As a result, packability cannot be improved.

Figure 9A:
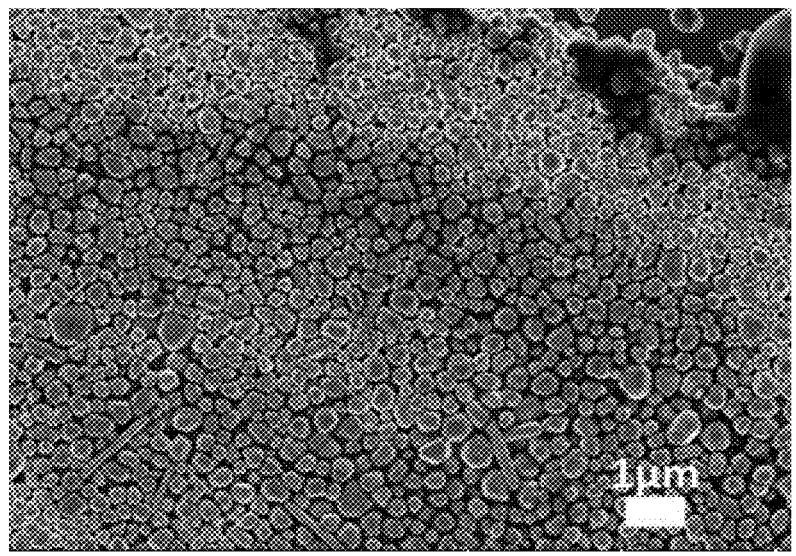
FIG. 9A presents an example SEM image in a second comparative example.
Figure 9B:
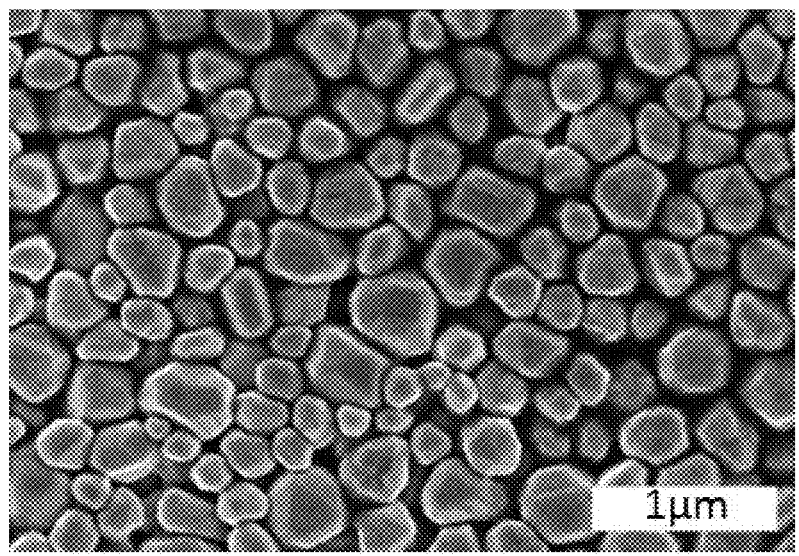
FIG. 9B presents a part of FIG. 9A in an enlarged scale.

The following describes a situation in which silver particles are synthesized without performing the step of reducing the dispersant D. FIG. 9A presents one example SEM image of silver particles (second comparative example) synthesized without performing the step of reducing the dispersant D. FIG. 9B presents a part of FIG. 9A in an enlarged scale. The silver particles presented in FIGS. 9A and 9B were synthesized by the following procedure.

That is, 0.5 g of polyvinylpyrrolidone (dispersant D) was dispersed in 25 g of ethylene glycol (polyalcohol PA1a) and 1.0 g of silver nitrate (silver compound C1) was dissolved in 25 g of ethylene glycol (polyalcohol PA1b). The ethylene glycols PA1a an PA1b were then mixed together. Subsequently, a resultant mixed ethylene glycol (polyalcohol PA1) was increased in temperature up to 150° C. (reaction temperature) and stirred then at a rotational speed of 500 rpm for 20 minutes for reaction while the reaction temperature was kept at 150° C. A reaction between the silver nitrate C1 and the ethylene glycol PA1 at that time generated a nitrogen oxide gas. While on the other hand, 2 g of silver nitrate (silver compound C2) was dissolved in 50 g of ethylene glycol (polyalcohol PA2b).

The ethylene glycol PA2b was dripped into the ethylene glycol PA1 over 30 minutes in a state in which the ethylene glycol PA1 was stirred at a rotational speed of 500 rpm while being kept at 150° C., thereby mixing the ethylene glycols PA1 and PA2b together.

Subsequently, a resultant mixed ethylene glycol (polyalcohol PA2) was stirred at a rotational speed of 500 rpm for two hours and 30 minutes for reaction while being kept at 150° C. (reaction temperature). A reaction between the silver nitrate C2 and the ethylene glycol PA2 at that time generated a nitrogen oxide gas.

The above procedure yielded the silver particles presented in FIGS. 9A and 9B. However, due to not being subjected to reduction of the dispersant D, fine silver particles were synthesized when compared with those subjected to reduction of the dispersant D. As a result, packability could not be improved when compared with that of the silver particles subjected to reduction of the dispersant D.

A description will be made next about a conducive paste producing method and a conductive paste according to the present embodiment. The conductive paste producing method according to the present embodiment further includes, followed by the silver particle synthesizing method described above, a step of mixing the synthesized silver particles with an alcohol. Consequently, the conductive paste according to the present embodiment contains the alcohol and the silver micro-particles P2 each having a polyhedral shape. More preferably, the conductive paste contains the silver micro-particles P2 each having a polyhedral shape, the silver nanoparticles P3, and the alcohol. For example, the silver particles P2 and P3 synthesized in the polyalcohol PA2 are separated from the polyalcohol PA2 and the separated silver particles P2 and P3 are washed three or four times using water or ethanol. The washed silver particles P2 and P3 are then dispersed in an alcohol (for example, ethanol). Through the above procedure, a conductive paste can be produced. The conductive paste according to the present embodiment can be used as a wiring material or a bonding material.

A ratio of the silver particles to the alcohol contained in the conductive paste is for example 4:1 to 16:1 in terms of parts by mass, preferably 6:1 to 12:1, and more preferably 8:1 to 10:1.

The alcohol is preferably a lower alcohol having at least one substituent selected from the group consisting of a lower alkoxy group, an amino group, and a halogen atom. Alternatively, the alcohol is a lower alcohol having an alkyl group having a carbon number of 1 to 6 and one to three, preferably, one or two hydroxyl groups. Examples of the lower alkyl group include straight chain or branched chain alkyl groups such as a methyl group, ethyl group, n-propyl group, i-propyl group, n-butyl group, i-butyl group, sec-butyl group, t-butyl group, n-pentyl group, i-pentyl group, sec-pentyl group, t-pentyl group, 2-methylbutyl group, n-hexyl group, 1-methylpentyl group, 2-methylpentyl group, 3-methylpentyl group, 4-methylpentyl group, 1-ethylbutyl group, 2-ethylbutyl group, 1,1-dimethylbutyl group, 2,2-dimethylbutyl group, 3,3-dimethylbutyl group, and 1-ethyl-1-methylpropyl group. Examples of the lower alcohol having an alkyl group having a carbon number of 1 to 6 and one to three hydroxyl groups include methanol, ethanol, ethylene glycol, n-propanol, i-propanol, triethylene glycol, n-butanol, i-butanol, sec-butanol, t-butanol, n-pentanol, i-pentanol, sec-pentanol, t-pentanol, 2-methylbutanol, n-hexanol, 1-methylpentanol, 2-methylpentanol, 3-methylpentanol, 4-methylpentanol, 1-ethylbutanol, 2-ethylbutanol, 1,1-dimethylbutanol, 2,2-dimethylbutanol, 3,3-dimethylbutanol, and 1-ethyl-1-methylpropanol.

In the lower alcohols having at least one substituent selected from the group consisting of a lower alkoxy group, an amino group, and a halogen atom, the substituent is as follows. An example of the lower alkoxy group may be a group that is a lower alkyl group having —O—. Examples of the lower alkoxy group include a methoxy group, ethoxy group, n-propoxy group, i-propoxy group, n-butoxy group, i-butoxy group, sec-butoxy group, t-butoxy group, and n-pentyloxy group. Examples of the halogen atom include fluorine, bromine, chlorine, and iodine.

Examples of the lower alcohol having at least one substituent selected from the group consisting of a lower alkoxy group, an amino group, and a halogen atom include methoxymethanol, 2-methoxyethanol, 2-ethoxyethanol, 2-chloroethanol, and ethanolamine.

Figure 10:
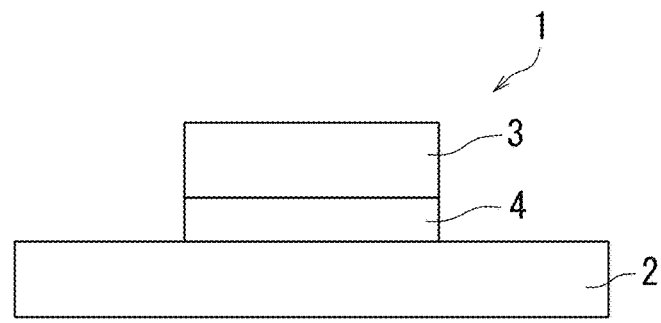
FIG. 10 is a schematic diagram illustrating a first bonding sample according to an embodiment of the present invention.

The following describes one example of shear strength obtained in a situation in which the conductive paste according to the present embodiment is used as a bonding material with reference to FIGS. 10-12, 13A, and 13B. Specifically, respective shear strengths measured in first to fifth shear strength tests will be described. The first shear strength test used a first bonding sample 1 illustrated in FIG. 10. FIG. 10 is a schematic diagram illustrating the first bonding sample 1 according to the present embodiment. As illustrated in FIG. 10, the first bonding sample 1 includes a copper substrate 2 plated with silver, a copper substrate 3 plated with silver, and a conductive paste 4. The conductive paste bonds the copper substrates 2 and 3 together. The conductive paste 4 was prepared using silver particles (silver micro-particles P2 and silver nanoparticles P3) synthesized through the same procedure (treatment) as that for obtaining the silver particles P2 and P3 presented in FIG. 7.

Specifically, the silver particles (silver micro-particles P2 and silver nanoparticles P3) were synthesized in ethylene glycol PA2 through the first to third steps and then separated from the ethylene glycol PA2 using a metal mesh. Subsequently, the separated silver particles P2 and P3 were washed using ethanol. The washed silver particles P2 and P3 were then dispersed in ethylene glycol to prepare the conductive paste 4. The conductive paste 4 was printed on the copper substrate 2 using a mask having a thickness of 0.1 μm, and the copper substrate 3 was placed on the printed conductive paste 4. Next, the copper substrates 2 and 3 were heated at a temperature of 200° C. for 60 minutes in an atmosphere for baking (sintering) the conductive paste 4, thereby bonding the copper substrates 2 and 3 together.

Figure 11:
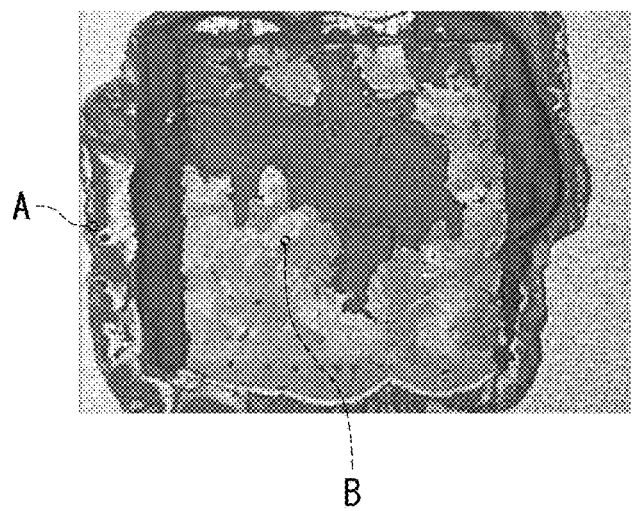
FIG. 11 presents an image of a copper substrate captured after a first shear strength test according to an embodiment of the present invention.
Figure 12:
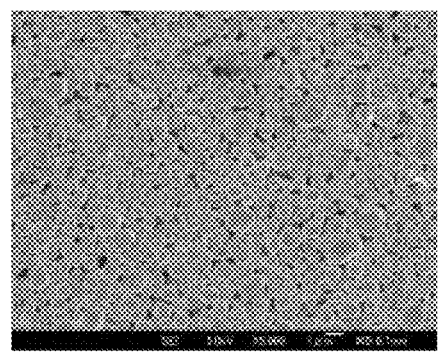
FIG. 12 presents a part A in FIG. 11 in an enlarged scale.
Figure 13A:
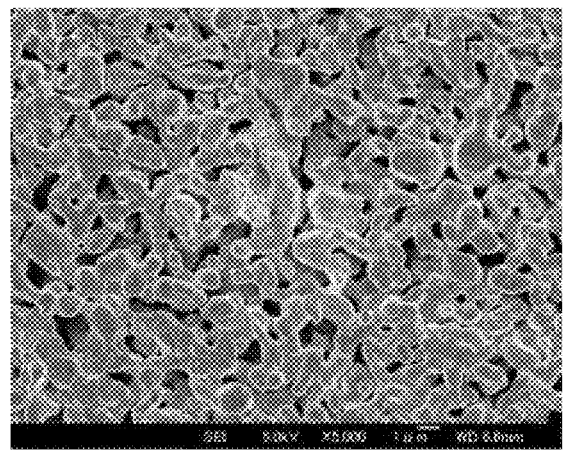
FIG. 13A presents a part B in FIG. 11 in an enlarged scale.
Figure 13B:
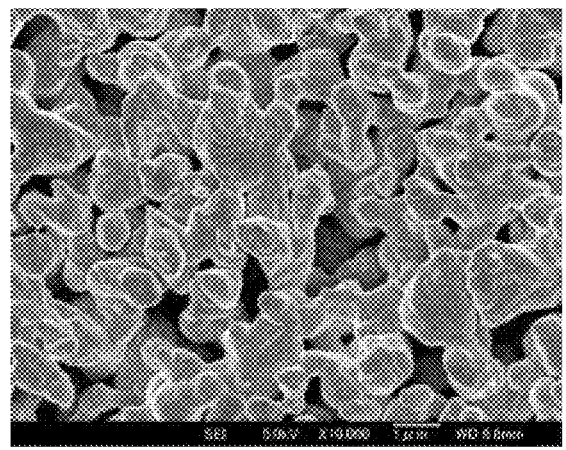
FIG. 13B presents a part in FIG. 13A in an enlarged scale.

Thereafter, shear force was applied to the copper substrates 2 and 3 bonded together and the shear strength was measured. The measurement resulted in a shear strength of at least 30 MPa. FIG. 11 presents an image of the copper substrate 2 after the shear strength measurement that is captured from the side where the conductive paste 4 is applied. FIG. 12 presents a part A in FIG. 11 in an enlarged scale. Specifically, the part A is a part of the copper substrate 2 to which the copper substrate 3 has not been bonded. FIG. 13A presents a part B in FIG. 11 in an enlarged scale. Specifically, the part B is a part of the copper substrate 2 to which the copper substrate 3 has been bonded. FIG. 13B also presents a part of FIG. 13A in an enlarged scale. As presented in FIGS. 12, 13A, and 13B, packability of the conductive paste 4 was excellent and the silver particles contained in the conductive paste 4 had a dense film shape as a result of baking. It is thought that a shear strength of at least 30 MPa could be attained with the silver particles in a dens film shape.

The respective shear strengths measured in second to fifth shear strength tests will be described next. The second to fifth shear strength tests contained the first bonding sample 1 likewise the first shear strength test. The second to fifth shear strength tests are different from the first shear strength test in silver particles used in the conductive paste 4. Specifically, the silver particles (reaction temperature 130° C.), the silver particles (reaction temperature 150° C.), the silver particles (reaction temperature 200° C.), and the silver core particles (reaction temperature 150° C.) were used in the second, third, fourth, and fifth shear strength tests, respectively. Note that the silver core particles P1 used in the fifth shear strength test were prepared by the following manner. The silver core particles P1 subjected to the same procedure (treatment) as that for the silver core particles P1 presented in FIG. 1 were synthesized in ethylene glycol PA1 and separated from the ethylene glycol PA1 using a metal mesh. Subsequently, the separated silver core particles P1 were washed using ethanol. The washed silver core particles P1 were then dispersed in ethylene glycol, thereby preparing the conductive paste 4. Thereafter, the copper substrates 2 and 3 were bonded together in the same manner as that in the first shear strength test.

The shear strength measured in the second shear strength test using the silver particles (reaction temperature 130° C.) was at least 40 MPa. The shear strength measured in the third shear strength test using the silver particles (reaction temperature 150° C.) was at least 25 MPa. The shear strength measured in the fourth shear strength test using the silver particles (reaction temperature 200° C.) was at least 30 MPa. By contrast, the shear strength measured in the fifth shear strength test using the silver core particles (reaction temperature 150° C.) was at least 5 MPa and no greater than 11 MPa. As such, the use of the conductive paste 4 containing the silver micro-particles P2 and the silver nanoparticles P3 could attain a shear strength of 25 MPa or more. In particular, the use of the silver particles (reaction temperature 130° C.) or the silver particles (reaction temperature 200° C.) could result in a shear strength of 30 MPa or more.

Figure 14:
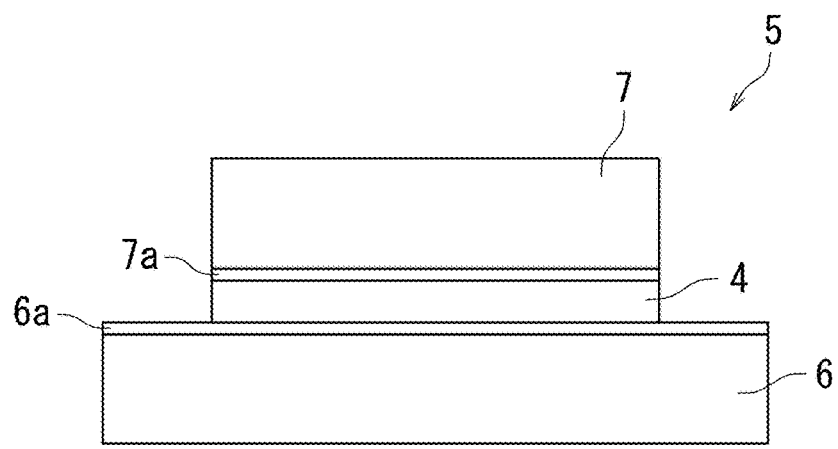
FIG. 14 is a schematic diagram illustrating a second bonding sample according to an embodiment of the present invention.

A description will be made next about a section of the conductive paste 4 used as a bonding material with reference to FIGS. 14-17. FIG. 14 is a schematic diagram illustrating a second bonding sample 5. The second bonding sample 5 includes the conductive paste 4, a copper substrate 6, and a copper dummy chip 7. The copper substrate 6 has one of main surfaces that is covered with a titanium-silver layer 6a. Specifically, a titanium layer and a silver layer are stacked in stated order on one of the main surfaces of the copper substrate 6. Similarly, the copper dummy chip 7 has one of main surfaces that is covered with a titanium-silver layer 7a. Specifically, a titanium layer and a silver layer are stacked in stated order on one of the main surfaces of the copper dummy chip 7. The copper substrate 6 and the copper dummy chip 7 are bonded together with the conductive paste 4 in a state in which the titanium-silver layer 6a is opposite to the titanium-silver layer 7a.

Specifically, silver particles (silver micro-particles P2 and silver nanoparticles P3) were synthesized in ethylene glycol PA2 through the first to third steps and separated from the ethylene glycol PA2 using a metal mesh. Subsequently, the separated silver particles P2 and P3 were washed using ethanol. The washed silver particles P2 and P3 were then dispersed in ethylene glycol to prepare the conductive paste 4. The conductive paste 4 was printed on the copper substrate 6 (titanium-silver layer 6a) using a mask having a thickness of 0.1 μm and the copper dummy chip 7 (titanium-silver layer 7a) was placed on the printed conductive paste 4. Next, the copper substrate 6 and the copper dummy chip 7 were heated at a temperature of 250° C. for 30 minutes in an atmosphere for baking (sintering) the conductive paste 4, thereby bonding the copper substrate 6 and the copper dummy chip 7 together.

Figure 15:
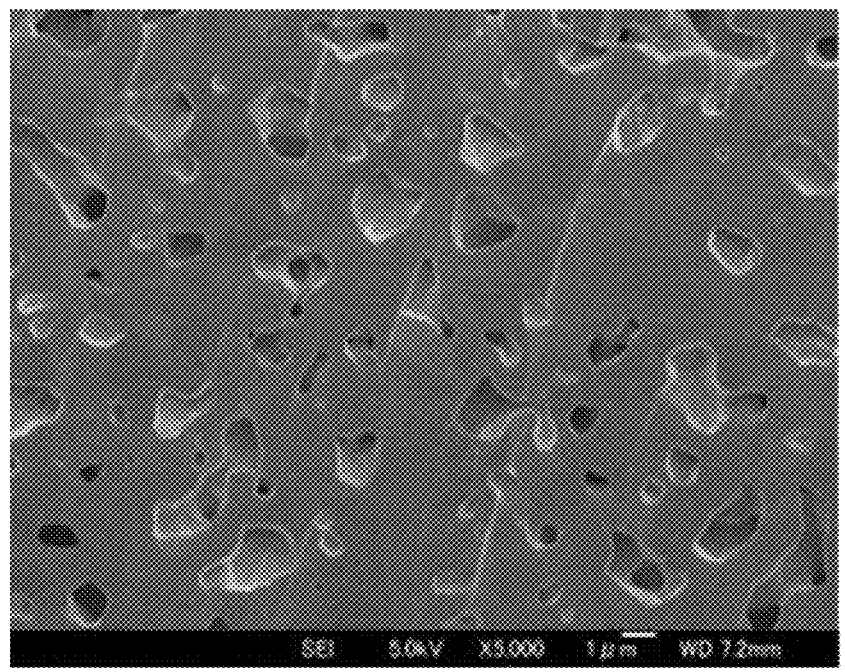
FIG. 15 presents one example SEM image of a section of a conductive paste used as a bonding material in the second bonding sample according to an embodiment of the present invention.
Figure 16:
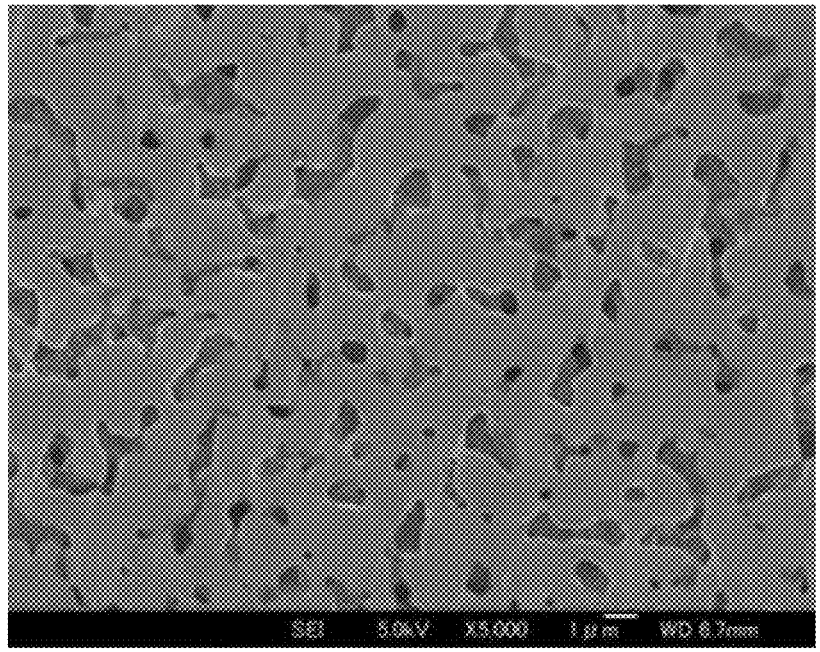
FIG. 16 presents one example SEM image of a section of a conductive paste used as a bonding material in the second bonding sample according to an embodiment of the present invention.
Figure 17:
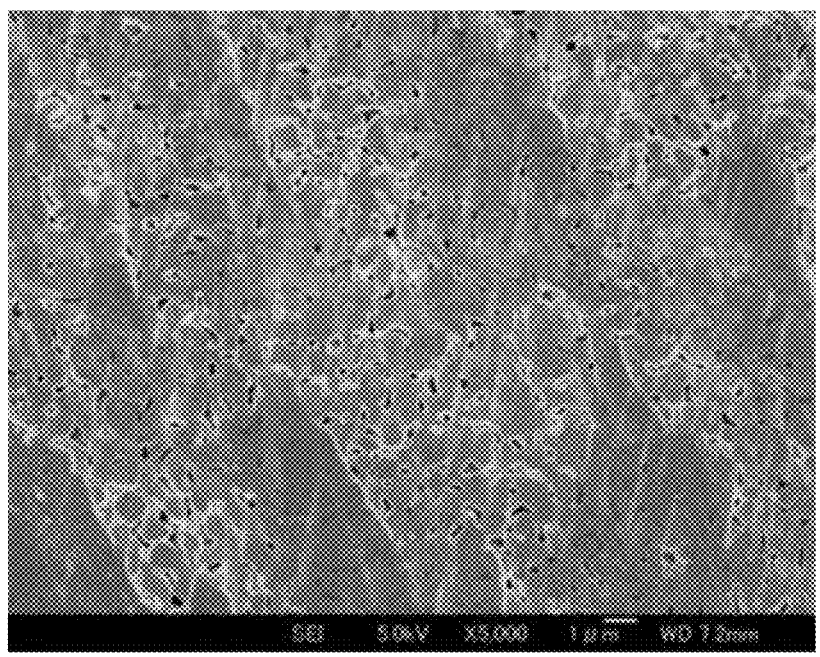
FIG. 17 presents one example SEM image of a section of a conductive paste used as a bonding material in the second bonding sample according to an embodiment of the present invention.

FIGS. 15-17 each present one example SEM image of a section of the conductive paste 4 used as a bonding material in the second bonding sample 5. Specifically, FIG. 15 presents a section of the conductive paste 4 prepared using the silver particles (reaction temperature 130° C.). FIG. 16 presents a section of the conductive paste 4 prepared using the silver particles (reaction temperature 150° C.). FIG. 17 presents a section of the conductive paste 4 prepared the silver particles (reaction temperature 200° C.). As presented in FIGS. 15-17, many gaps were formed through the use of the silver particles (reaction temperature 150° C.) when compared with those formed through the use of the silver particles (reaction temperature 130° C.) or the silver particles (reaction temperature 200° C.). In short, packing density was low. The low packing density as above is thought to decrease the shear strength in the second bonding sample 5 that used the silver particles (reaction temperature 150° C.) when compared with the second bonding sample 5 that used the silver particles (reaction temperature 130° C.) or the silver particles (reaction temperature 200° C.). Note that a factor of decreased packing density is thought to be significant dissociation of the average particle diameter (a peak value of scattering intensity) between the silver micro-particles P2 and the silver nanoparticles P3 subjected to the third step at a reaction temperature of 150° C. when compared with those between the silver micro-particles P2 and the silver nanoparticles P3 subjected to the third step at a reaction temperature of 130° C. or 200° C., as described with reference to FIGS. 4-6.

Figure 18:
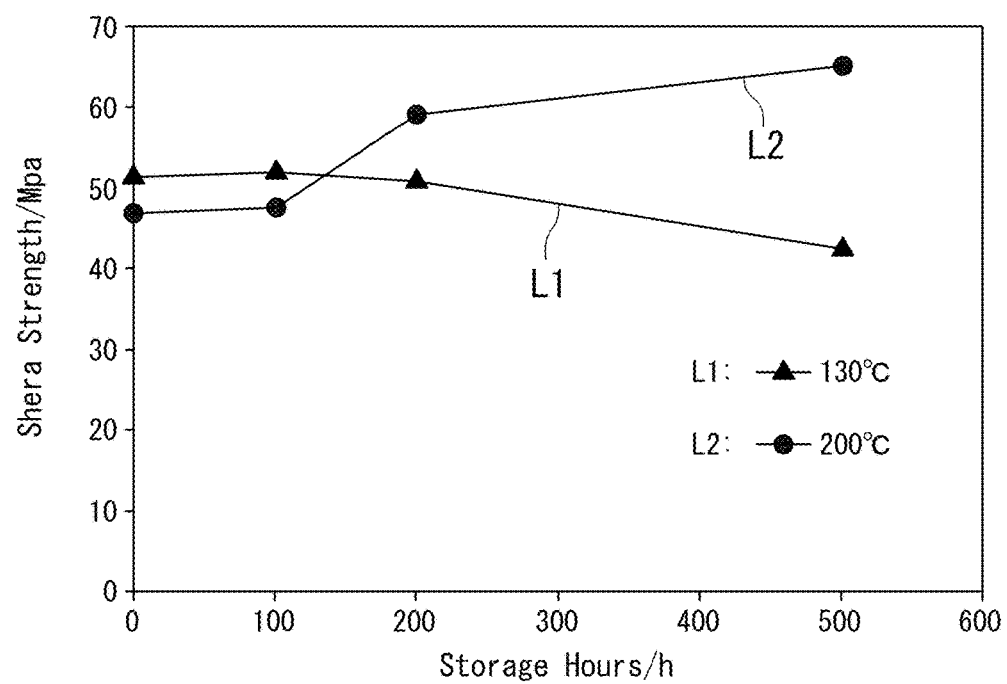
FIG. 18 is a graph representation indicating variations in shear strength of the second bonding samples according to an embodiment of the present invention.

A description will be made next about variation in shear strength that occurs in a situation in which the second bonding samples 5 is left in a high-temperature environment with reference to FIG. 18. FIG. 18 is a graph representation indicating variations in shear strength of the second bonding samples 5. Specifically, FIG. 18 indicates respective variations in shear strength of the second bonding samples 5 that occurred in a situation in which the copper substrates 6 and the copper dummy chips 7 were heated at a temperature of 250° C. for 30 minutes for baking (sintering) the respective conductive pastes 4 and then the second bonding samples 5 were left in an atmosphere at a temperature of 250° C.

In FIG. 18, the vertical axis represents shear strength (MPa) and the horizontal axis represents time (hour). In FIG. 18, a polyline L1 represents a variation in shear strength of a second bonding sample 5 of which bonding material is a conductive paste 4 prepared using the silver particles (reaction temperature 130° C.) and a polyline L2 represents a variation in shear strength of a second bonding sample 5 of which bonding material is a conductive paste 4 prepared using the silver particles (reaction temperature 200° C.).

As indicated in FIG. 18, the shear strength of the second bonding sample 5 including the conductive paste 4 containing the silver particles (reaction temperature 130° C.) was at least 50 MPa directly after baking. The shear strength of the second bonding sample 5 including the conductive paste 4 containing the silver particles (reaction temperature 130° C.) decreased with time to at least 40 MPa and no greater than 45 MPa after elapse of 500 hours from the baking of the conductive paste 4. By contrast, the shear strength of the second bonding sample 5 including the conductive paste 4 containing the silver particles (reaction temperature 200° C.) was at least 45 MPa and no greater than 50 MPa directly after baking. The shear strength of the second bonding sample 5 including the conductive paste 4 containing the silver particles (reaction temperature 200° C.) increased with time to at least 55 MPa and no greater than 65 MPa after elapse of 500 hours from the baking of the conductive paste 4. As a result, the use of the silver particles (reaction temperature 130° C.) or the silver particles (reaction temperature 200° C.) could attain a shear strength of 40 MPa or more even after the baked conductive paste 4 was left in a high-temperature environment.

According to the present embodiment, silver particles having improved packability can be obtained and production of a conductive paste using the silver particles can achieve improvement of bonding strength. As such, use of the conductive paste according to the present embodiment as a wiring material can achieve formation of a wire having high bonding strength.

Results of thermal analysis on conductive pastes 4 according to the present embodiment will be described next with reference to FIG. 19. Specifically, conductive pastes 4 were heated and respective variations in weight thereof were measured. In the present embodiment, the thermal analysis was performed on three conductive pastes 4. The three conductive pastes 4 differ in reaction temperature in the third step. Specifically, thermal analysis was performed on a first conductive paste 4a produced through the third step at a reaction temperature of 130° C., a second conductive paste 4b produced through the third step at a reaction temperature of 150° C., and a third conductive paste 4c produced through the third step at a reaction temperature of 200° C.

Figure 19:
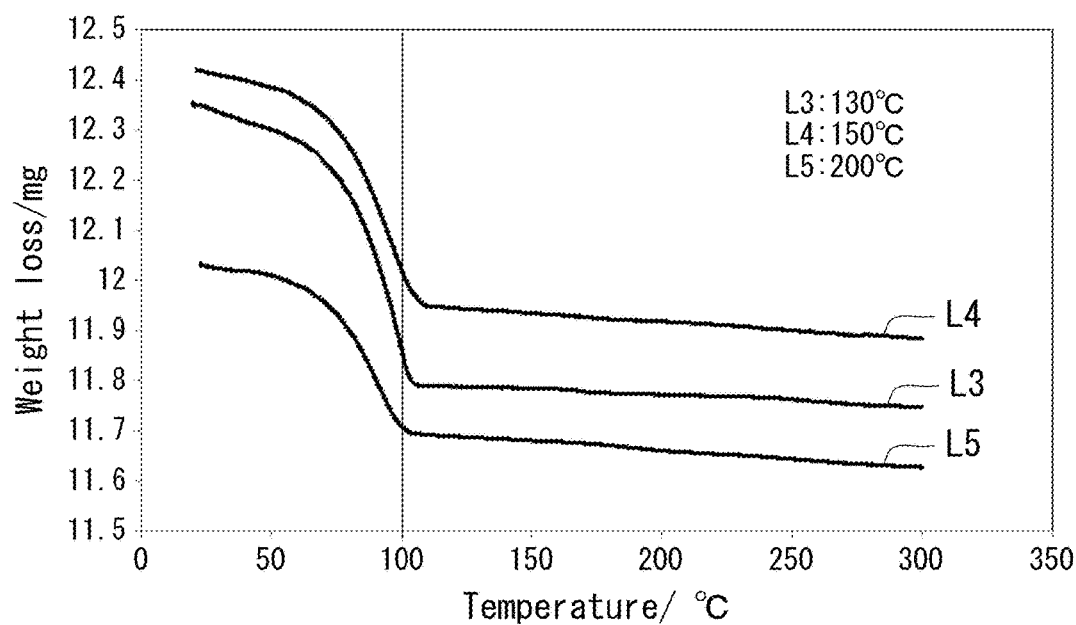
FIG. 19 is a graph representation indicating results of thermal analysis on the conductive pastes according to an embodiment of the present invention.

FIG. 19 indicates respective variations in weight loss of the first to third conductive pastes 4a-4c. In FIG. 19, the vertical axis represents weight loss of the first to third conductive pastes 4a-4c and the horizontal axis represents baking temperature for the first to third conductive pastes 4a-4c. In FIG. 19, a curve L3 represents a variation in weight loss of the first conductive paste 4a. A curve L4 represents a variation in weight loss of the second conductive paste 4b. A curve L5 represents a variation in weight loss of the third conductive paste 4c.

As indicated in FIG. 19, the respective weights of the first to third conductive pastes 4a-4c decreased by about 2.9% to 3.8% at around 100° C. A factor of the weight losses of the first to third conductive pastes 4a-4c is thought to be volatilization of organic matter by heating. The organic matter that is volatilized is ethylene glycol and ethanol. In a situation in which polyvinylpyrrolidone remains in the silver particles, the polyvinylpyrrolidone is also volatilized.

By contrast, respective weight losses of the first to third conductive pastes 4a-4c were small between 100° C. and 200° C. This indicates that the amount of residual organic matter was small. As such, the amount of organic matter contained in the conductive paste 4 can be reduced in the present embodiment even when the conductive paste 4 is baked at low temperature (about 150° C.). Reduction in the amount of organic matter can result in the silver particles in a dense film shape.

One example of volume resistivity (electric resistivity) obtained in a configuration in which the conductive paste 4 according to the present embodiment is used as a wiring material will be described next with reference to FIG. 20. Specifically, a description will be made about results of measurement of the volume resistivities of wires on a glass substrate that each are made of the conductive paste 4. The conductive paste 4 was prepared using silver particles (silver micro-particles P2 and silver nanoparticles P3) synthesized through the same procedure (treatment) as that for the silver particles P2 and P3 shown in FIG. 7.

Figure 20:
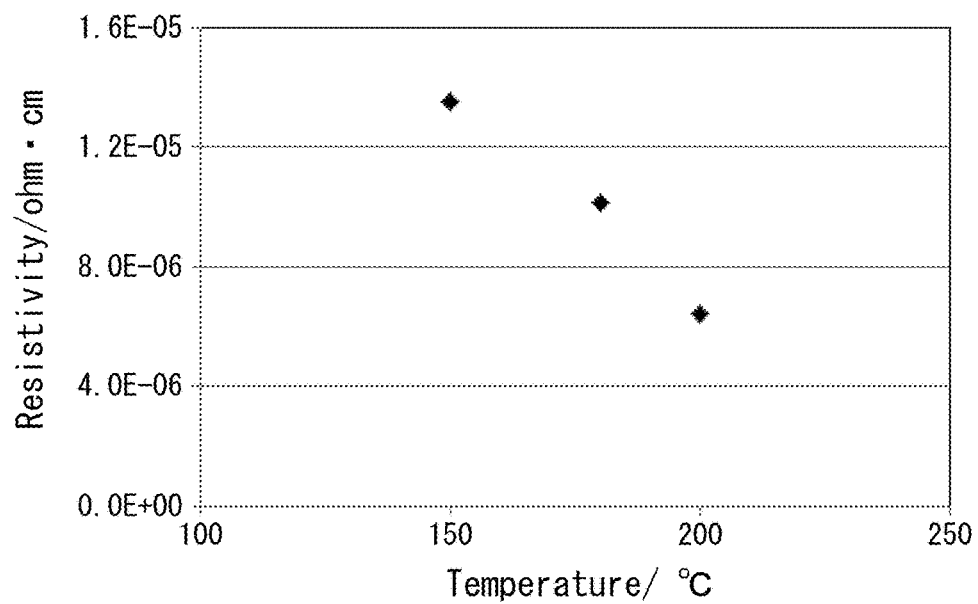
FIG. 20 is a graph representation indicating volume resistivities of wires according to an embodiment of the present invention.

FIG. 20 indicates volume resistivities of three types of wires. The types of three wires were formed by baking the conductive paste 4 at respective baking temperatures of 150° C., 180° C., and 200° C. In FIG. 20, the vertical axis represents volume resistivity and the horizontal axis represents baking temperature.

As indicated in FIG. 20, sufficiently low resistivity (volume resistivity in the order of $10^{-5}$ Ω·cm) could be attained even in a configuration that was subjected to baking at a low temperature of about 150° C. This indicates that the silver particles contained in the conductive paste 4 exhibit favorable packability. The higher the baking temperature was, the lower the volume resistivity was. In particular, a volume resistivity in the order of $10^{-6}$ Ω·cm could be attained in a configuration that was subjected to baking at a temperature of 200° C.

Figure 21:
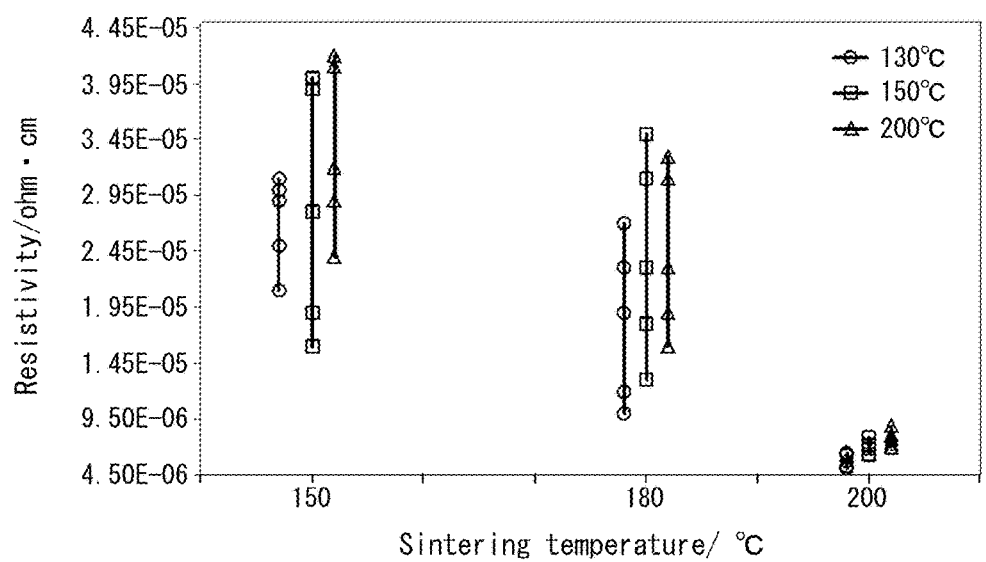
FIG. 21 is a graph representation indicating other example volume resistivities of wires according to an embodiment of the present invention.

The following describes examples volume resistivities (electric resistivities) obtained in respective configurations in which the aforementioned first to third conductive pastes 4a-4c each are used as a wiring material with reference to FIG. 21. Specifically, a description will be made about results of measurement of the volume resistivities of respective wires each on a glass substrate that were made of the first to third conductive pastes 4a-4c.

Circles in FIG. 21 represent respective volume resistivities of the three types of wires of which wiring material is the first conductive paste 4a. The three types of wires were formed through baking the first conductive paste 4a at respective baking temperatures of 150° C., 180° C., and 200° C. Similarly, squares represent respective volume resistivities of the three types of wires formed through baking the second conductive paste 4b at respective baking temperatures of 150° C., 180° C., and 200° C. Triangles represent respective volume resistivities of the three types of wires formed through baking the third conductive paste 4c at respective baking temperatures of 150° C., 180° C., and 200° C. In FIG. 21, the vertical axis represents volume resistivity and the horizontal axis represents baking temperature.

As indicated in FIG. 21, sufficiently low resistivity (volume resistivity in the order of $10^{-5}$ Ω·cm) could be attained in configurations that were subjected to baking at a low temperature of about 150° C. The higher the baking temperature was, the lower the volume resistivity was. In particular, volume resistivity in the order of $10^{-6}$ Ω·cm could be attained in configurations that were subjected to baking at a temperature of 200° C.

Note that a distribution in volume resistivity of the second conductive paste 4b (squares) was wider than those of the first and third conductive pastes 4a (circles) and 4c (triangles) in the configurations that were subjected to baking at a temperature of 150° C. Similarly, a distribution in volume resistivity of the second conductive paste 4b (squares) was wider than those of the first and third conductive pastes 4a (circles) and 4c (triangles) also in the configurations that were subjected to baking at a temperature of 180° C. A reason for the above is thought to be that respective particle diameter ranges (distributions) of the silver micro-particles P2 and the silver nanoparticles P3 in configurations that were subjected to the third step at a reaction temperature of 150° C. were wider than those in configurations that were subjected to the third step at a reaction temperature of 130° C. or 200° C., as described with reference to FIGS. 4-6.

As described above, silver particles having improved packability can be obtained according to the present embodiment. Further, production of a conductive paste using the silver particles can attain sufficiently low resistivity (volume resistivity in the order of $10^{-5}$ Ω·cm) even in a configuration that is subjected to baking at low temperature (about 150° C.). Furthermore, through the above, use of the conductive paste according to the present embodiment as a bonding material can enable sufficient reduction in resistivity between bonding members that are bonded together.

Although the present embodiment describes a situation in which the polyol method is employed for synthesis of the silver core particles P1, no limitation is imposed on the method for synthesizing the silver core particles P1. The respective types of the silver compound C1, the dispersant D, and the reductant R1 are not limited particularly so long as the silver core particles P1 having an average particle diameter (median diameter) in the order of nanometers can be synthesized. For example, the silver core particles P1 may be synthesized by a hydrothermal synthesis method or the like. In a situation in which the hydrothermal synthesis method is employed, polyvinylpyrrolidone (PVP) can be used as a reductant for a metal salt of silver (silver compound). In the above situation, the polyvinylpyrrolidone acts as both a reductant and a dispersant.

INDUSTRIAL APPLICABILITY

According to the present invention, packability of silver particles can be improved. The present invention is useful for bonding a component having low thermal resistance or a wire to be formed on a component having low thermal resistance.

REFERENCE SIGNS LIST 1 first bonding sample
2, 3, 6 copper substrate
4 conductive paste
5 second bonding sample
7 copper dummy chip

The invention claimed is:

1. A silver particle synthesizing method comprising:
synthesizing first silver particles each covered with a dispersant by causing a reaction between a first silver compound and a first reductant in a liquid phase containing the dispersant;
reducing the dispersant from the first silver particles to obtain second silver particles having an average particle diameter of at least 100 nanometers and no greater than 500 nanometers; and
synthesizing third silver particles each in a polyhedral shape while synthesizing fourth silver particles by causing a reaction between a second silver compound and a second reductant in a liquid phase containing the second silver particles, the third silver particles having a first particle diameter distribution, the fourth silver particles having a second particle diameter distribution different from the first particle diameter distribution, wherein
the first particle diameter distribution has an average particle diameter range of at least 1 micrometer and no greater than 15 micrometers, and
the second particle diameter distribution has an average particle diameter range of at least 100 nanometers and less than 1 micrometer.

2. The silver particle synthesizing method according to claim 1, wherein
the second reductant is a polyalcohol.

3. The silver particle synthesizing method according to claim 2, wherein
in the synthesizing third silver particles, the third silver particles are synthesized by heating the polyalcohol in which the second silver compound is dissolved and in which the second silver particles are dispersed.

4. The silver particle synthesizing method according to claim 2, wherein
in the synthesizing third silver particles, the third silver particles are synthesized by dripping a first polyalcohol into a second polyalcohol and heating the polyalcohol, the second silver compound being dissolved in the first polyalcohol, the second silver particles being dispersed in the second polyalcohol, the polyalcohol containing the first and second polyalcohols.

5. The silver particle synthesizing method according to claim 4, wherein
the second polyalcohol is heated while the first polyalcohol is dripped.

6. The silver particle synthesizing method according to claim 1, wherein
the first reductant is a polyalcohol, and
in the synthesizing first silver particles, the first silver particles are synthesized by heating the polyalcohol in which the first silver compound is dissolved and in which the dispersant is dispersed.

7. Silver particles comprising:
silver particles each in a polyhedral shape having a first particle diameter distribution; and
silver particles having a second particle diameter distribution different from the first particle diameter distribution, wherein
the first particle diameter distribution has an average particle diameter range of at least 1 micrometer and no greater than 15 micrometers,
the second particle diameter distribution has an average particle diameter range of at least 100 nanometers and less than 1 micrometer, and
the silver particles in the polyhedral shape each have a crystal surface.

8. A conductive paste producing method comprising:
synthesizing first silver particles each covered with a dispersant by causing a reaction between a first silver compound and a first reductant in a liquid phase containing the dispersant;
reducing the dispersant from the first silver particles to obtain second silver particles having an average particle diameter of at least 100 nanometers and no greater than 500 nanometers;
synthesizing third silver particles each in a polyhedral shape while synthesizing fourth silver particles by causing a reaction between a second silver compound and a second reductant in a liquid phase containing the second silver particles, the third silver particles having a first particle diameter distribution, the fourth silver particles having a second particle diameter distribution different from the first particle diameter distribution; and producing a conductive paste by mixing the third and fourth silver particles with an alcohol, wherein the first particle diameter distribution has an average particle diameter range of at least 1 micrometer and no greater than 15 micrometers, and the second particle diameter distribution has an average particle diameter range of at least 100 nanometers and less than 1 micrometer.

9. A conductive paste comprising:

silver particles each in a polyhedral shape having a first particle diameter distribution;

silver particles having a second particle diameter distribution different from the first particle diameter distribution; and an alcohol, wherein the first particle diameter distribution has an average particle diameter range of at least 1 micrometer and no greater than 15 micrometers, the second particle diameter distribution has an average particle diameter range of at least 100 nanometers and less than 1 micrometer, and the silver particles in the polyhedral shape each have a crystal surface.

10. The conductive paste according to claim 9, which has an electric resistivity of at least $1.0 \times 10^{-6}$ $\Omega$·cm and no greater than $1.0 \times 10^{-5}$ $\Omega$·cm after baking at a temperature of 200° C.

* * * * *